United States Patent
Hioka et al.

(10) Patent No.: US 8,331,191 B2
(45) Date of Patent: Dec. 11, 2012

(54) SEMICONDUCTOR INTEGRATED CIRCUIT DEVICE

(75) Inventors: Takeshi Hioka, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/233,694

(22) Filed: Sep. 15, 2011

(65) Prior Publication Data

US 2012/0068763 A1 Mar. 22, 2012

(30) Foreign Application Priority Data

Sep. 17, 2010 (JP) ................................. 2010-210001

(51) Int. Cl.
*G11C 8/00* (2006.01)
(52) U.S. Cl. ............ 365/230.06; 365/230.08; 365/233.1
(58) Field of Classification Search ............... 365/233.1, 365/230.06, 230.08, 185.25; 326/112, 113, 326/119, 120, 122, 55
See application file for complete search history.

(56) References Cited

U.S. PATENT DOCUMENTS

| 3,986,042 A * | 10/1976 | Padgett et al. ................. 326/121 |
| 7,345,511 B2 * | 3/2008 | Morgenshtein et al. ...... 326/122 |
| 7,716,625 B2 * | 5/2010 | Morgenshtein et al. ...... 716/104 |
| 2010/0237931 A1 | 9/2010 | Ogiwara et al. |

FOREIGN PATENT DOCUMENTS

JP 2007-194771 8/2007

* cited by examiner

*Primary Examiner* — Gene Auduong
(74) *Attorney, Agent, or Firm* — Oblon, Spivak, McClelland, Maier & Neustadt, L.L.P.

(57) ABSTRACT

According to one embodiment, a semiconductor integrated circuit device includes an output circuit which includes an inverter having a first transistor and a second transistor whose current paths are series-connected between a first power supply voltage and a second power supply voltage, a first diode circuit one end of which is connected to the first power supply voltage, and the other end of which is connected to a control terminal of the first transistor, and an adjustment circuit which forms a current path for discharging a charge of the control terminal of the first transistor to the second power supply voltage when an input clock is at a first level.

12 Claims, 11 Drawing Sheets

Clock generation unit 19-1 (first embodiment)

(Size : M1 ≒ M2 > M3)

Clock generation unit (when there is no adjustment circuit 33)

FIG. 4

When there is no adjustment circuit 33 (Vth increases)

FIG. 5

Vout (first embodiment)

FIG. 6

Clock generation unit 19-1 (modification example 1)

(Size : M1 ≅ M2 > M3)

FIG. 7

When there is no adjustment circuit 33

FIG. 8

Vout (modification example 1)

FIG. 9

Second embodiment (Size : M1 ≒ M2 > M3 ≒ M41)

FIG. 10

Vout (Second embodiment)

Comparative example 1

FIG. 16

Comparative example 1

FIG. 17

Comparative example 2

FIG. 18

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2010-210001, filed Sep. 17, 2010, the entire contents of which are incorporated herein by reference.

FIELD

Embodiments described herein relate generally to a semiconductor integrated circuit device and the like.

BACKGROUND

In a semiconductor integrated circuit device, as a clock generator (CLK generator) for generating an output clock with a relatively large amplitude from an input clock, a CLK generator for generating a high amplitude using a basic power supply can be used.

DETAILED DESCRIPTION

In general, according to one embodiment, a semiconductor integrated circuit device includes an output circuit which includes an inverter having a first transistor and second transistor whose current paths are series-connected between the first power supply voltage and the second power supply voltage, a first diode circuit one end of which is connected to the first power supply voltage and the other end of which is connected to a control terminal of the first transistor, and an adjustment circuit which forms a current path for discharging a charge on the control terminal of the first transistor to the second power supply voltage when an input clock is at the first level.

As described above, as a CLK generator for generating an output clock with a relatively large amplitude from an input clock, a CLK generator for generating a high amplitude using a basic power supply can be used.

In the above arrangement of the CLK generator, however, when a clock generation operation lasts for a long time, it is impossible to prevent an increase in voltage level, thereby causing a variation in output. This tends to be a disadvantage to stabilizing the operation.

Embodiments and the like will be described below with reference to the accompanying drawings. Note that in the following description, the same reference numerals denote the same parts throughout the drawings.

First Embodiment

A semiconductor integrated circuit device according to the first embodiment will be explained with reference to FIGS. 1 to 6.

1. Arrangement Example

1-1. Overall Arrangement Example

An overall arrangement example of the semiconductor integrated circuit device according to the first embodiment will be described with reference to FIG. 1. In this embodiment, a NAND flash memory is exemplified.

Figure 1:
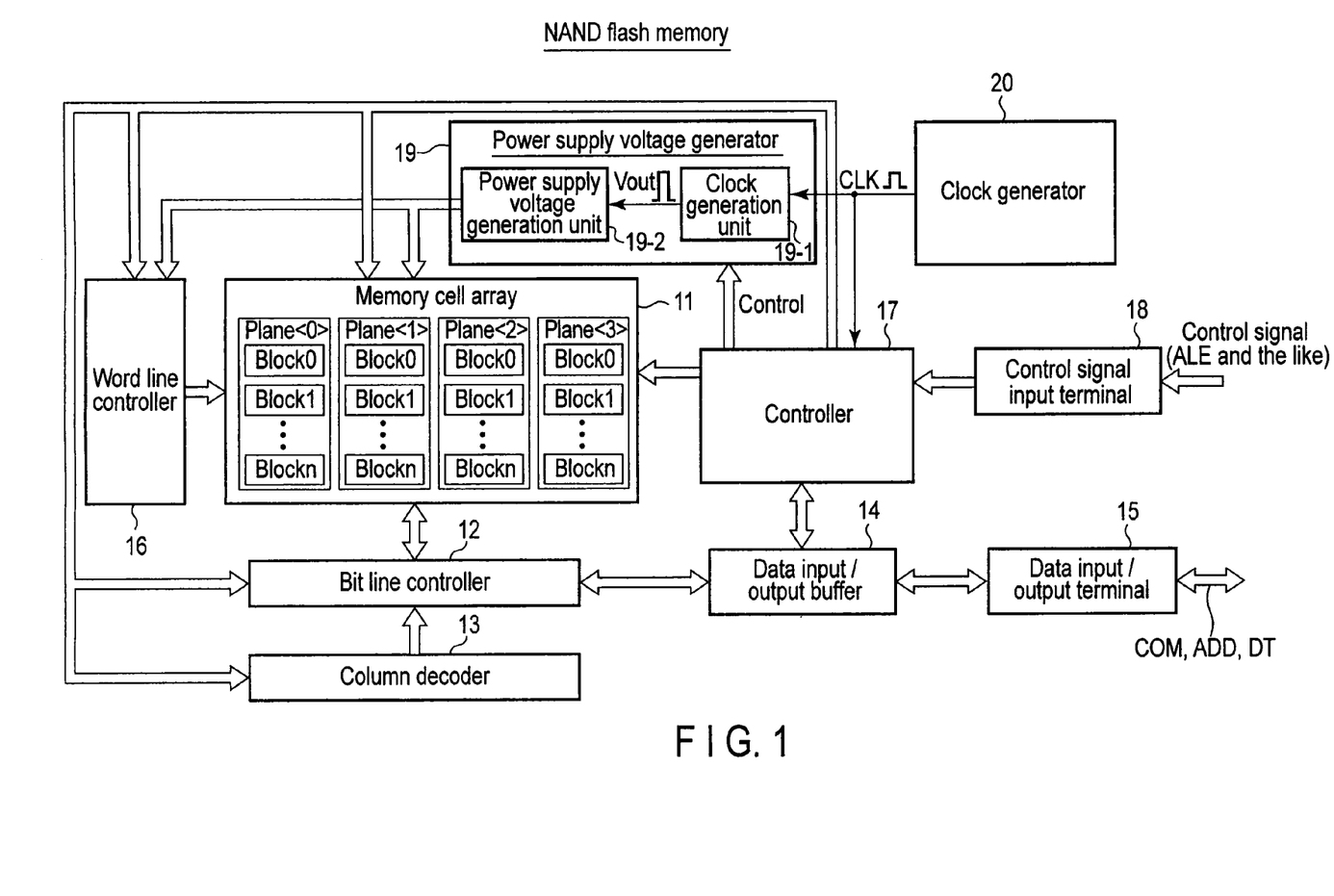
FIG. 1 is a block diagram showing an overall arrangement example of a semiconductor integrated circuit device according to the first embodiment.

As shown in FIG. 1, the semiconductor integrated circuit device according to the first embodiment includes a memory cell array 11, a bit line controller 12, a column decoder 13, a data input/output buffer 14, a data input/output terminal 15, a word line controller 16, a controller 17, a control signal input terminal 18, a power supply voltage generator 19, and a CLK generator 20.

In this example, the memory cell array 11 includes a plurality of planes. In this case, the memory cell array 11 has a multi-plane arrangement including four planes (Plane<0>, Plane<1>, Plane<2>, and Plane<3>). Each plane includes a plurality of blocks (Block 0 to Block n) each of which has a plurality of memory cells (not shown) arranged at the intersection positions of word lines and bit lines in a matrix topology. The word line controller 16 for controlling the word lines, the bit line controller 12 for controlling the bit lines, the controller 17, and the power supply voltage generator 19 are electrically connected with the memory cell array 11.

The bit line controller 12 reads data of memory cells in the memory cell array 11 via the bit lines, and detects the states of the memory cells in the memory cell array 11 via the bit lines. The bit line controller 12 also writes data in memory cells in the memory cell array 11 by applying a write control voltage to the memory cells via the bit lines. The column decoder 13, the data input/output buffer 14, and the controller 17 are electrically connected with the bit line controller 12.

There are provided a sense amplifier (S/A), a data storage circuit, and the like (not shown) within the bit line controller 12. The data storage circuit is selected by the column decoder 13. The data of memory cells which has been read into the data storage circuit is output outside from the data input/output terminal 15 via the data input/output buffer 14. The data input/output terminal 15 is connected to, for example, a host device and the like outside the NAND flash memory.

The host device is, for example, a microcomputer or the like, and receives data output from the data input/output terminal 15. Furthermore, the host device outputs, to the data input/output terminal 15, a command COM for controlling the operation of the NAND flash memory, an address ADD, and data DT. The write data DT input from the host device to the data input/output terminal 15 is supplied, via the data input/output buffer 14, to the data storage circuit (not shown) selected by the column decoder 13. On the other hand, the command COM and address ADD are supplied to the controller 17.

The word line controller 16 selects a word line in the memory cell array 11, and applies, to the selected word line, a voltage necessary for a read, write, or erase operation, which is given by the power supply voltage generator 19.

The controller 17 is electrically connected to the memory cell array 11, bit line controller 12, column decoder 13, data input/output buffer 14, word line controller 16, and power supply voltage generator 19. The controller 17 controls the above connected constituent circuits. The controller 17 is connected to the control signal input terminal 18, and is controlled by a control signal such as an ALE (Address Latch Enable) signal input from the external host device via the control signal input terminal 18. The controller 17 controls the power supply voltage generator 19 by outputting a control signal (to be described later) to the power supply voltage generator 19.

Under the control of the controller 17, the power supply voltage generator 19 supplies a necessary power supply voltage to the memory cell array 11, the word line controller 16, and the like in each operation such as a write, read, or erase operation. The power supply voltage generator 19 includes a clock generation unit 19-1 and a power supply voltage generation unit 19-2.

From a clock CLK with a short period and a relatively small amplitude given by the CLK generator 20, the clock generation unit 19-1 generates an output clock Vout with a short period and a larger amplitude. The power supply voltage generation unit 19-2 receives the clock Vout generated by the clock generation unit 19-1, and supplies a necessary power supply voltage to the memory cell array 11 and the like in each operation such as a write, read, or erase operation under the control of the controller 17. This will be described in detail later.

In this example, the CLK generator 20 supplies at least the clock CLK to the controller 17 and power supply voltage generator 19. Note that there may be provided a new CLK generator in addition to the clock supplied to the controller 17.

The word line controller 16, bit line controller 12, column decoder 13, controller 17, and power supply voltage generator 19 constitute a write circuit, read circuit, and erase circuit.

1-2. Arrangement Example of Block

An arrangement example of a block according to the first embodiment will be explained next with reference to FIG. 2. One block BLOCK is exemplified here. Memory cell transistors MT in this block BLOCK are collectively erased. That is, a block is an erase unit.

Figure 2:
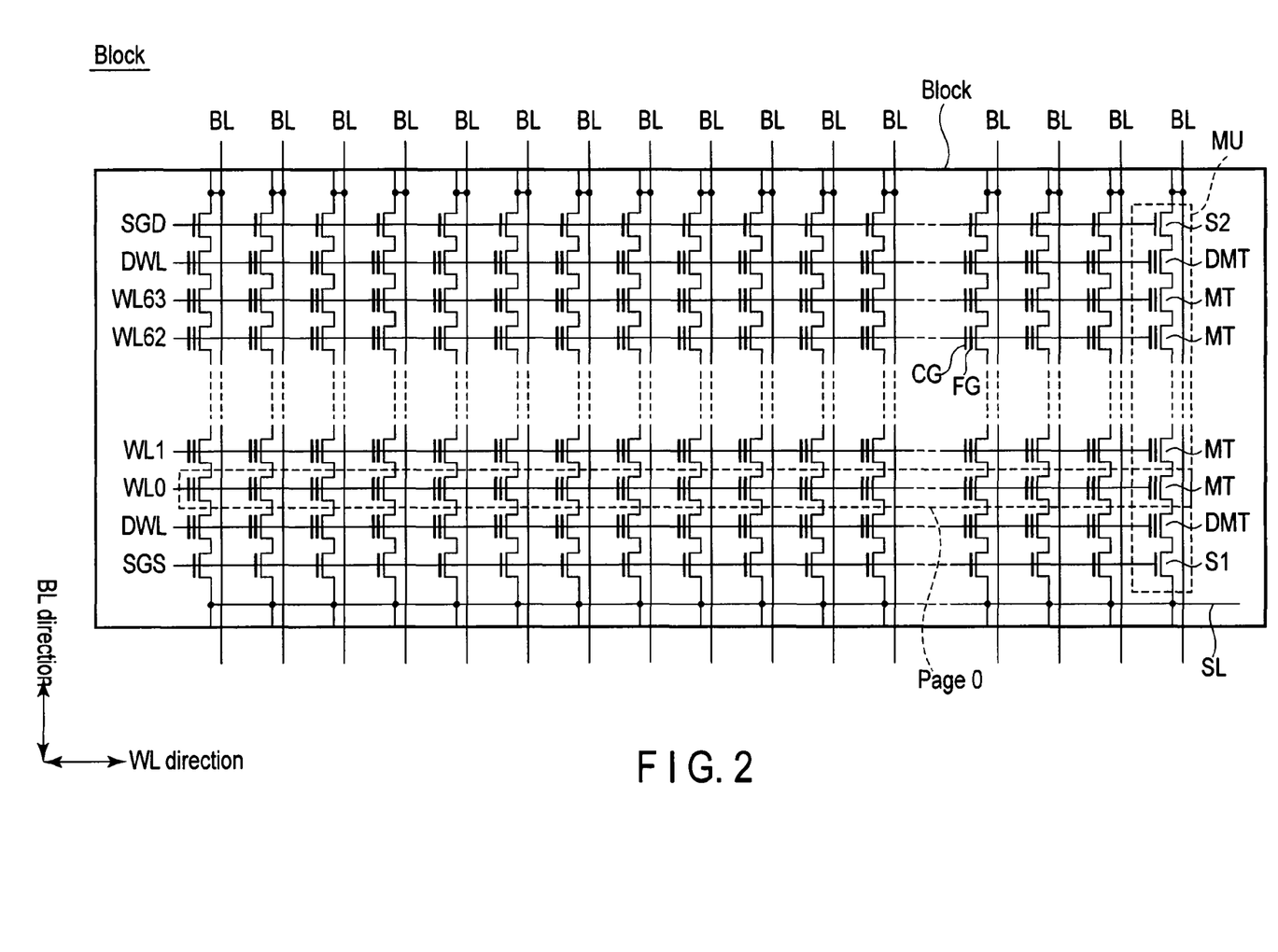
FIG. 2 is an equivalent circuit diagram showing a block in FIG. 1.

As shown in FIG. 2, the block BLOCK includes a plurality of memory cell columns (memory cell units) MU arranged in a word line direction (WL direction). Each memory cell column MU includes a NAND string having two dummy cells DMT and 64 memory cell transistors MT whose current paths are series-connected, a selection transistor S1 connected to one end of the NAND string, and a selection transistor S2 connected to the other end of the NAND string. Although the NAND string includes the 64 memory cells MT in this example, the NAND string need only include at least two memory cells, and the number of memory cells is not particularly limited to this.

The other end of the current path of the selection transistor S2 is connected to a corresponding bit line BL, and the other end of the current path of the selection transistor S1 is connected to a source line SL.

Word lines WL0 to WL63 and dummy word lines DWL run in the WL direction, and are commonly connected to the plurality of memory cell transistors MT or dummy cells DMT in the WL direction. A select gate line SGD runs in the WL direction, and is commonly connected to the plurality of selection transistors S2 in the WL direction. A select gate line SGS also runs in the WL direction, and is commonly connected to the plurality of selection transistors S1 in the WL direction.

A unit called a page is formed for each of the word lines WL0 to WL63. As shown by surrounding by a broken line in FIG. 2, for example, one page (Page 0) is assigned to the word line WL0. Since a read operation or write operation is performed for each page, a page is a read unit and a write unit. Note that for a multi-level memory cell which can hold multi-bit data in one memory cell, a plurality of pages are assigned to one word line.

Each memory cell MT is arranged at the intersection position of a bit line BL and a word line WL, and has a stacked structure in which there are provided, on a semiconductor substrate, a tunnel insulating film, a floating electrode FG serving as a charge accumulation layer, an inter-gate insulating film, and a control electrode CG. A source/drain serving as the current path of the memory cell MT is series-connected to the source/drain of the neighboring memory cell MT. One end of the current path is connected to the corresponding bit line BL via the selection transistor S2, and the other end of the current path is connected to the source line SL via the selection transistor S1. Each memory cell MT includes a spacer provided along the side wall of the stacked structure, and a source and drain which are provided in the semiconductor substrate (Si substrate (Si-sub) or p-well) so as to sandwich the stacked structure between them.

Each of the selection transistors S1 and S2 includes a gate insulating film, an inter-gate insulating film, and a gate electrode. The inter-gate insulating film of the selection transistor S1 or S2 is provided so that it is separated at the center, and its upper and lower layers are electrically connected. Each of the selection transistors S1 and S2 also includes a spacer provided along the side wall of its gate electrode, and a source and drain which are provided in the semiconductor substrate so as to sandwich the gate electrode between them.

1-3. Clock Generation Unit

An arrangement example of the clock generation unit 19-1 according to the first embodiment will be described next with reference to FIG. 3.

Figure 3:
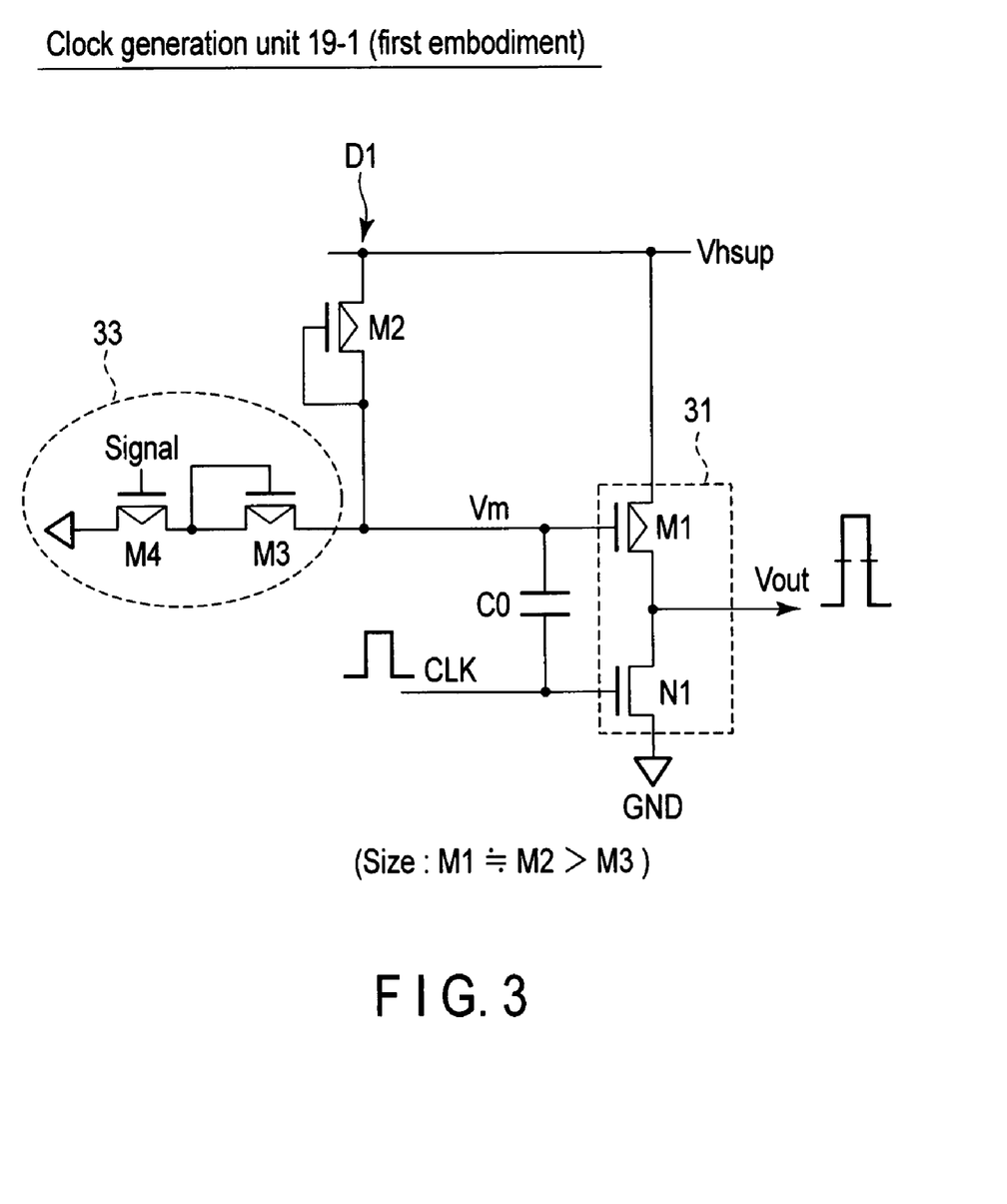
FIG. 3 is an equivalent circuit diagram showing the clock generation unit of the semiconductor integrated circuit device according to the first embodiment.

As shown in FIG. 3, the clock generation unit 19-1 according to the first embodiment includes a first diode circuit D1, an output circuit 31 having an inverter, a capacitor C0, and an adjustment circuit 33.

In this example, the first diode circuit D1 includes a PMOS transistor M2. The source of the PMOS transistor M2 is connected to a power supply voltage Vhsup, and the drain and gate of the PMOS transistor M2 are connected to a node Vm. According to the diode circuit D1, it is possible to determine the initial value of the node Vm when the clock generation unit 19-1 outputs an output Vout. By comparing with a threshold value of a transistor M1 of the output circuit 31, the first diode circuit D1 can determine a level at which the voltage of the output Vout is stabilized.

The output circuit 31 includes an inverter constituted by the PMOS transistor M1 and an NMOS transistor N1. The PMOS transistor M1 has its source connected to the power supply voltage Vhsup, its drain connected to an output terminal (Vout), and its gate connected to the node Vm. The NMOS transistor N1 has its source connected to a ground power supply voltage GND, its drain connected to the output terminal (Vout), and its gate connected to receive the clock CLK input from the CLK generator 20.

The capacitor C0 has one electrode connected to the node Vm, and its other electrode connected to receive the clock CLK. Providing the capacitor C0 enables the clock CLK (an amplitude which can control the threshold value of the PMOS M1) as an input signal to control transfer and interrupt of a high voltage with a small amplitude.

In this example, the adjustment circuit 33 includes PMOS transistors M3 and M4. The current paths of the PMOS transistors M3 and M4 are series-connected between the node Vm and the ground power supply voltage GND. The PMOS transistor M3 has its gate connected to its source; it is diode-connected. A control signal Signal sent from the controller 17 is input to the gate of the PMOS transistor M4. The adjustment circuit 33 serves as a discharge circuit in the node Vm in a clock generation operation (to be described later). It is, therefore, possible to make the initial value of the output Vout and the voltage level of the node Vm constant. This will be described in detail later.

2. Clock Generation Operation

The clock generation operation of the semiconductor integrated circuit device according to the first embodiment will be explained with reference to FIGS. 4 to 6.

2-1. Principles

As described above, the basic of the arrangement of the clock generation unit 19-1 according to this embodiment is the inverter of the output circuit 31. The clock CLK (assumed to have an amplitude Vhsup–0 V) as an input of the inverter is connected to the gate of the NMOS transistor N1 and one electrode of the capacitor. On the other hand, a voltage that has dropped from the power supply voltage Vhsup by the threshold value (in the current path of the transistor M2) and has been raised or lowered by the amplitude of the clock CLK is applied to the gate of the PMOS transistor M1. The voltage of the node Vm is therefore given by equation (1).

$$Vm = (Vhsup - Vth) \pm Vhsup \qquad \text{equation (1)}$$

As a result, a voltage level with an amplitude Vhsup–0 V is output as the output Vout.

2-2. When there is No Adjustment Circuit

The clock generation operation of the semiconductor integrated circuit device when there is no adjustment circuit 33 will be explained with reference to FIGS. 4 and 5.

Figure 4:
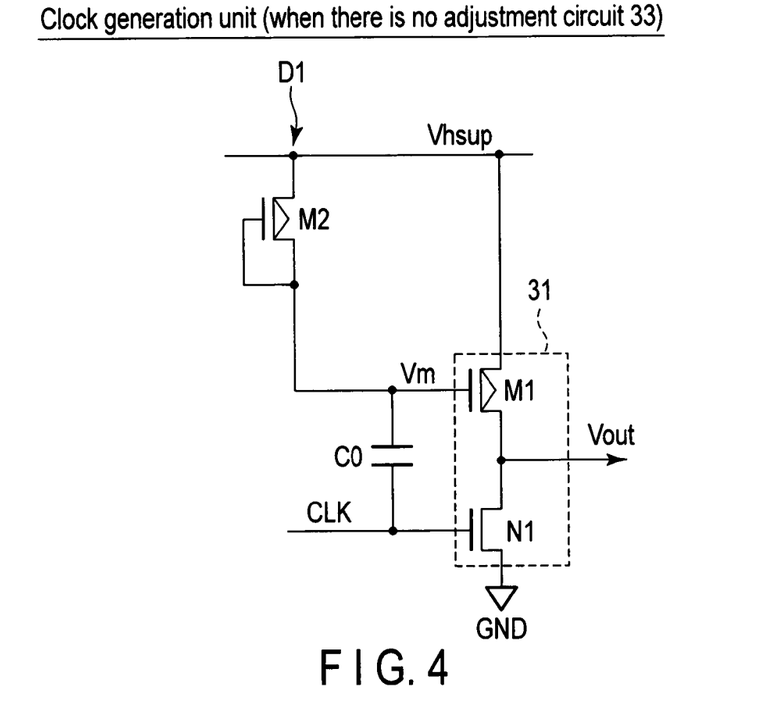
FIG. 4 is an equivalent circuit diagram showing a clock generation unit which does not include an adjustment circuit according to the first embodiment.

FIG. 4 shows the arrangement of the clock generation unit according to the first embodiment when there is no adjustment circuit 33.

Figure 5:
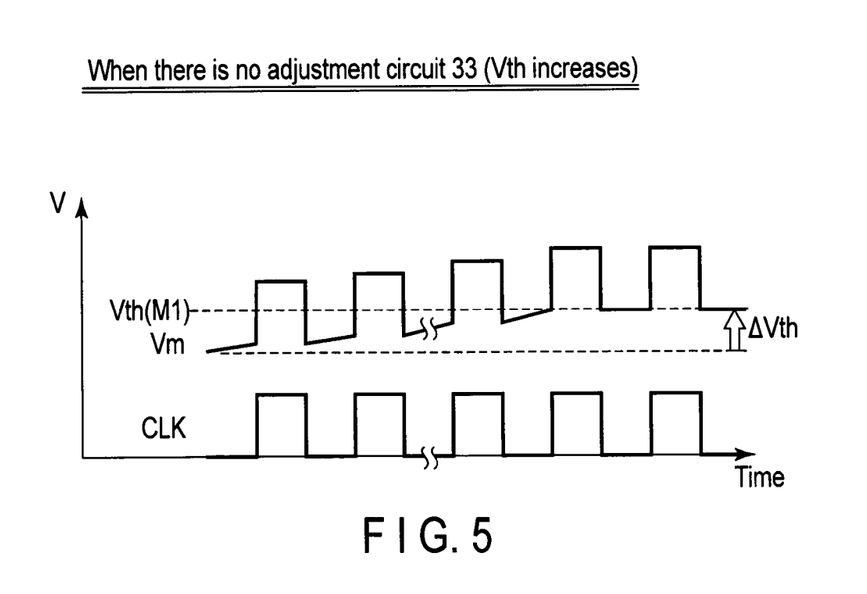
FIG. 5 is a timing chart showing the relationship between time and a voltage in a node Vm having the arrangement shown in FIG. 4.

FIG. 5 shows the relationship between time and a voltage (V) in the node Vm when there is no adjustment circuit 33.

As shown in FIG. 5, since there is no adjustment circuit 33, it is impossible to discharge charges of the node Vm, thereby disabling to make the initial value of the output Vout and the voltage level of the node Vm constant.

As shown in FIG. 5, therefore, if an operation lasts for a long time, the value of the node Vm continues to increase ($\Delta$Vth).

This is because the initial value is set larger than the threshold value of the PMOS transistor M1, and the PMOS transistor M1 is turned on when the clock CLK="L" level. On the other hand, since the initial value of the node Vm is determined by diode connection (M1), charges are transferred from the power supply voltage Vhsup to the node Vm when the clock CLK="H" level. Consequently, as shown in FIG. 5, a lower limit voltage level of the node VM continues to increase, and eventually enters the OFF region.

2-3. When there is Adjustment Circuit

The clock generation operation of the semiconductor integrated circuit device according to the first embodiment when there is the adjustment circuit 33 will be described with reference to FIG. 6.

As in this example, when the adjustment circuit 33 is arranged, an increase in voltage level of the node Vm shown in FIG. 5 is avoided.

At the beginning of the clock generation operation and in the operation, the adjustment circuit 33 can form a current discharge path (DC path) for discharging charges on the node Vm when the clock CLK="L" level. In other words, the adjustment circuit 33 serves to maintain a voltage level for turning on the PMOS transistor M1.

Since the initial value of the node Vm is set larger than the threshold value of the transistor M1, and a voltage level which has dropped from the initial value by the power supply voltage Vhsup is applied in the clock generation operation, the transistor M1 is turned on when the clock CLK="L" level. When the clock CLK="H" level, since the voltage level of the node Vm is larger than the threshold value, the transistor M1 is turned off.

Figure 6:
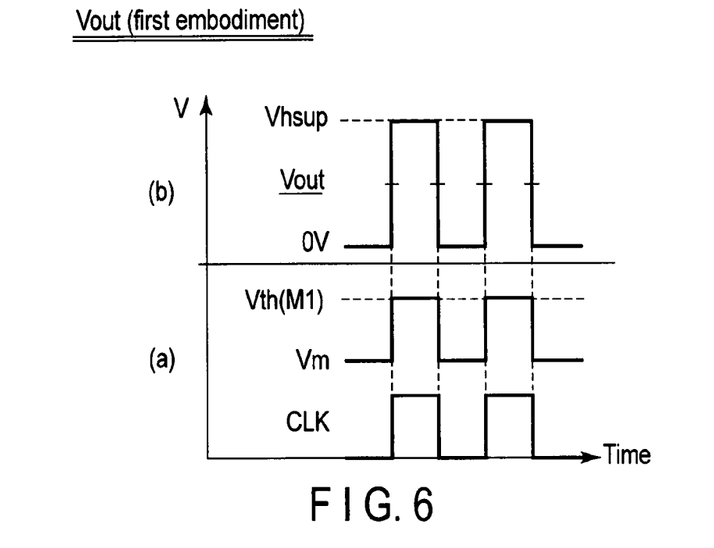
FIG. 6 is a timing chart showing an output of the clock generation unit of the semiconductor integrated circuit device according to the first embodiment.

Consequently, as shown in (b) of FIG. 6, a voltage level (about 10 V or higher) with a relatively large amplitude Vhsup–0 V is output as the output Vout. As shown in (a) of FIG. 6, an upper limit of the voltage level of the node Vm never exceeds the threshold value Vth(M1) of the transistor M1.

As described above, according to the arrangement of this embodiment, even if the clock generation operation lasts for a long time, it is possible to prevent an increase in voltage level of the node Vm, thereby stabilizing the operation.

To increase the resistance of the PMOS transistor M3, a sufficiently long channel length (L) is desirable. The size of the transistor M3, therefore, is desirably larger than that of the transistor M1 or M2 (Size: M1≈M2>M3).

3. Operation and Effect

According to the semiconductor integrated circuit device of the first embodiment, at least the following effects (1) and (2) can be obtained.

(1) The device is advantageous to stabilizing the operation because a variation in output is small.

As described above, the clock generation unit 19-1 of the semiconductor integrated circuit device according to the first embodiment includes at least the first diode circuit D1 whose anode is connected to the first power supply voltage Vhsup, the output circuit 31 which includes the inverter having the first transistor M1 and the second transistor N1 whose current paths are series-connected between the first power supply voltage Vhsup and the second power supply voltage GND, and the adjustment circuit 33 which forms the current discharge path (DC path) for discharging the charges of the gate of the first transistor M1 to the second power supply voltage GND when the input clock CLK is at the "L" level.

Consequently, as shown in (b) of FIG. 6, it is possible to output a voltage level (about 10 V or more) with a relatively large amplitude Vhsup–0 V. As shown in (a) of FIG. 6, an upper limit of the voltage level of the node Vm serving as the gate of the transistor M1 never exceeds the threshold value Vth(M1) of the transistor M1.

As described above, according to the clock generation unit 19-1 of this embodiment, even if the clock generation operation lasts for a long time, it is possible to prevent an increase in voltage level of the node Vm, and a variation in output is small, thereby advantageously stabilizing the operation.

In addition, in this example, there is provided the capacitor C0 one electrode of which is connected to the node Vm, and the other electrode of which receives the input clock CLK. Providing the capacitor C0 has an advantage that the clock CLK (an amplitude of which can control the threshold value of the PMOS M1) as an input signal can control transfer and interrupt of a high voltage with a small amplitude. Such control of transfer and interrupt of a high voltage with a small amplitude is more advantageous in generating a clock necessary for a refined large-capacity semiconductor memory such as the NAND flash memory of this embodiment.

(2) The device is advantageous to micronization and decreasing power consumption.

As described above, since the clock generation unit 19-1 of the semiconductor integrated circuit device according to the first embodiment does not need n capacitors C10 to generate a clock having a high voltage as an upper limit unlike Comparative Example 1 (to be described later), it is possible to prevent an increase in area, providing an advantage in terms of micronization.

It is also unnecessary to pump out charges of charged transistors N21 and N22 unlike Comparative Example 2, thereby advantageously decreasing power consumption.

Modification Example 1

Example when there is Also Provided Second Diode Circuit

The semiconductor integrated circuit device according to Modification Example 1 will be described next with reference to FIGS. 7 to 9. Modification Example 1 relates to an example when there is also provided a second diode circuit. A repetitive detailed description of the same parts as in the first embodiment will be omitted.

Arrangement Example

An arrangement example of the clock generation unit 19-1 according to Modification Example 1 will be explained with reference to FIG. 7.

Figure 7:
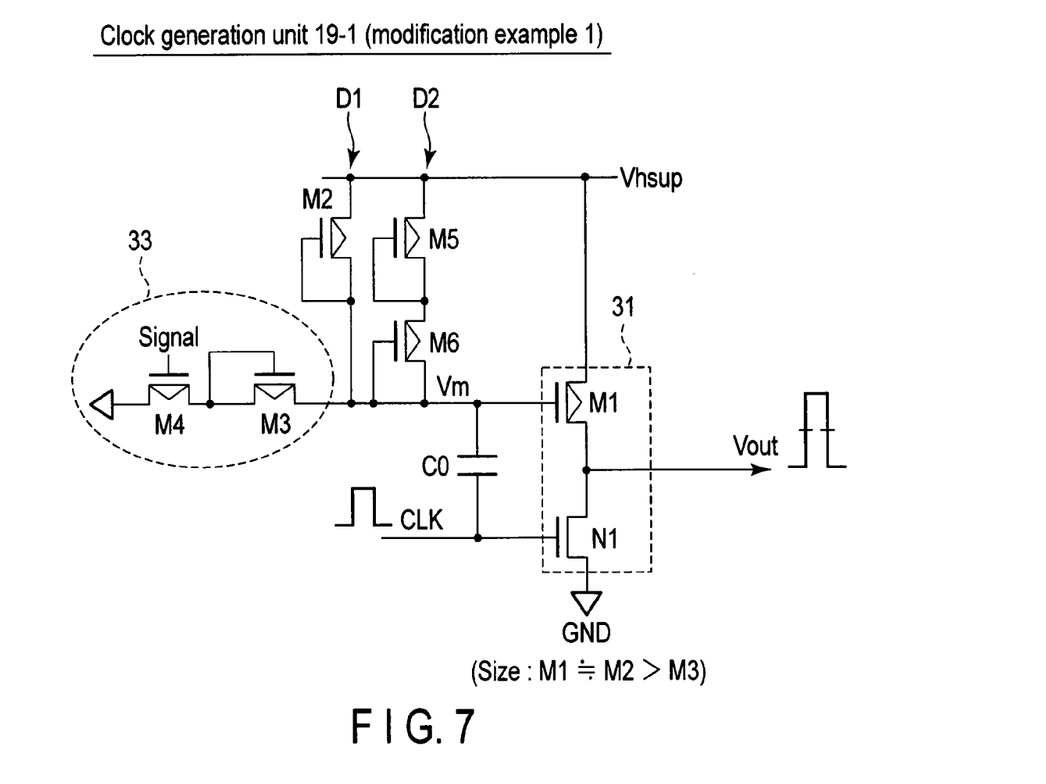
FIG. 7 is an equivalent circuit diagram showing the clock generation unit of the semiconductor integrated circuit device according to Modification Example 1.

As shown in FIG. 7, the clock generation unit 19-1 according to Modification Example 1 is different from that in the first embodiment in that there is also provided a second diode circuit D2.

The second diode circuit D2 includes PMOS transistors M5 and M6 whose current paths are series-connected between the power supply voltage Vhsup and the node Vm. The PMOS transistor M5 has its source connected to the power supply voltage Vhsup, and its drain and gate connected to the source of the PMOS transistor M6. The drain and gate of the PMOS transistor M6 are connected to the node Vm.

Providing the second diode circuit D2 enables to set the initial value of the node Vm to be smaller than the threshold value of the transistor M1. As shown in FIG. 9 (to be described later), a variation in voltage is set so that the voltage level of the node Vm exceeds or does not exceed the threshold value of the transistor M1. A transfer method to the output Vout is the same as in the first embodiment.

<Clock Generation Operation>

The clock generation operation of the semiconductor integrated circuit device according to Modification Example 1 will be described with reference to FIGS. 8 and 9.

When there is No Adjustment Circuit

The clock generation operation of the semiconductor integrated circuit device when there is no adjustment circuit 33 will be explained with reference to FIG. 8. The arrangement is the same as that in the first embodiment, and is therefore not shown.

Figure 8:
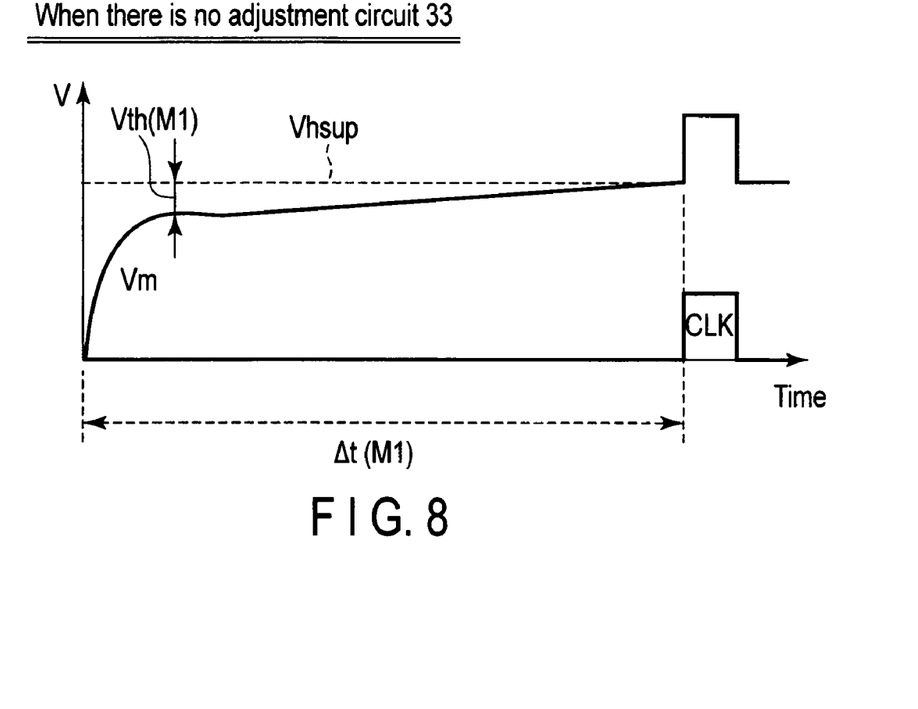
FIG. 8 is a timing chart showing the relationship between time and a voltage in the node Vm having the arrangement shown in FIG. 7 in a standby state.

FIG. 8 shows the relationship between time and a voltage in the node Vm if a standby state lasts for a long time, when there is no adjustment circuit 33.

As shown in FIG. 8, the voltage level of the node Vm drops from the power supply voltage Vhsup by the threshold value Vth of the transistor M1 by diode connection. If, however, a standby state lasts for a long time, and a clock generation operation is not performed for a long time Δt (M1), the voltage level of the node Vm increases to the power supply voltage Vhsup. In this case, when the input clock CLK is input to start next clock generation, the initial value of the node Vm has become the power supply voltage Vhsup. When this happens, the output may enter a region where the transistor M1 is not turned on.

When there is Adjustment Circuit

The clock generation operation of the semiconductor integrated circuit device according to the first embodiment when there is the adjustment circuit 33 will be explained with reference to FIG. 9.

As in this example, when the adjustment circuit 33 is arranged, an increase in voltage level of the node Vm, shown in FIG. 8, if a standby state lasts for a long time is avoided.

That is, as described above, at the beginning of the clock generation operation and in the operation, the adjustment circuit 33 forms a current discharge path (DC path) for discharging charges of the node Vm when the clock CLK="L" level. In other words, the adjustment circuit 33 serves to maintain a voltage level for turning on the PMOS transistor M1.

Figure 9:
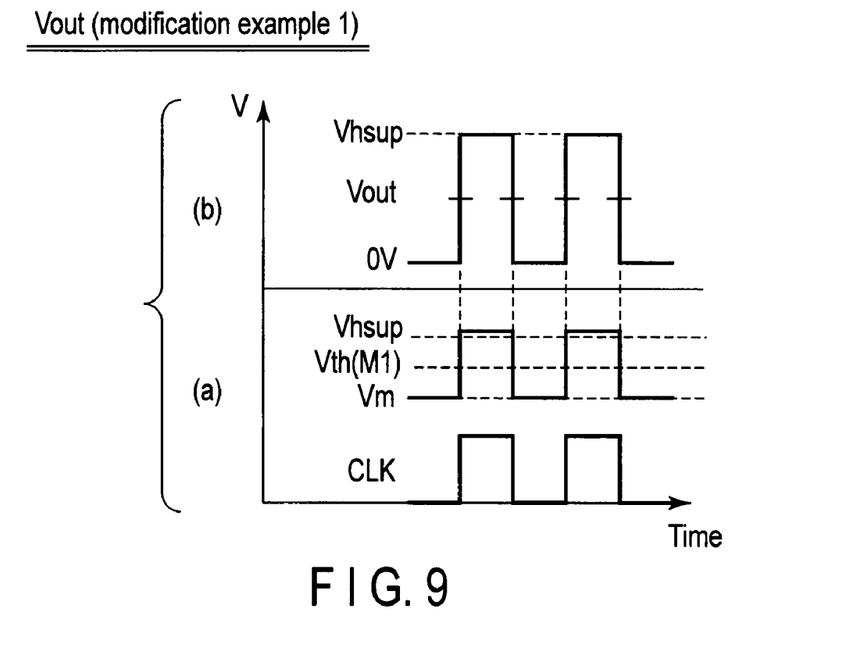
FIG. 9 is a timing chart showing an output of the clock generation unit of the semiconductor integrated circuit device according to Modification Example 1.

Consequently, as shown in (b) of FIG. 9, it is possible to output, as the output Vout, a voltage level with a relatively large amplitude Vhsup–0 V. On the other hand, as shown in (a) of FIG. 9, even if a standby state lasts for a long time, and a clock generation operation is not performed for a long time, an upper limit of the voltage level of the node Vm serving as the gate of the transistor M1 never exceeds the threshold value Vth(M1) of the transistor M1.

In Modification Example 1, even if a standby state lasts for a long time and a clock generation operation is not performed for a long time, an upper limit of the voltage level of the node Vm serving as the gate of the transistor M1 never exceeds the threshold value Vth(M1) of the transistor M1. This effect is the same as that obtained in the above-described first embodiment.

<Operation and Effect>

According to the semiconductor integrated circuit device of Modification Example 1, it is possible to obtain at least the same effects (1) and (2) described above.

The clock generation unit 19-1 of the semiconductor integrated circuit device according to Modification Example 1 also includes the second diode circuit D2.

Providing the second diode circuit D2 enables to set the initial value of the node Vm to be smaller than the threshold value of the transistor M1.

As shown in (b) of FIG. 9, for example, it is possible to output, as the output Vout, a voltage level with a relatively large amplitude Vhsup–0 V. On the other hand, as shown in (a) of FIG. 9, even if a standby state lasts for a long time and a clock generation operation is not performed for a long time, the initial value of the node Vm is set smaller than the threshold value of the transistor M1, and an upper limit of the voltage level of the node Vm serving as the gate of the transistor M1 never exceeds the threshold value Vth(M1) of the transistor M1.

It is thus possible to apply the arrangement of Modification Example 1, as needed.

Second Embodiment

Example when there is Also Provided Upper Limit Circuit for Limiting Upper Limit of Vm A semiconductor integrated circuit device according to the second embodiment will be described with reference to FIGS. 10 and 11. The second embodiment relates to an example when an upper limit circuit 35 for limiting an upper limit of a node Vm. A repetitive detailed description of the same parts as in the first embodiment will be omitted.

Arrangement Example

Figure 10:
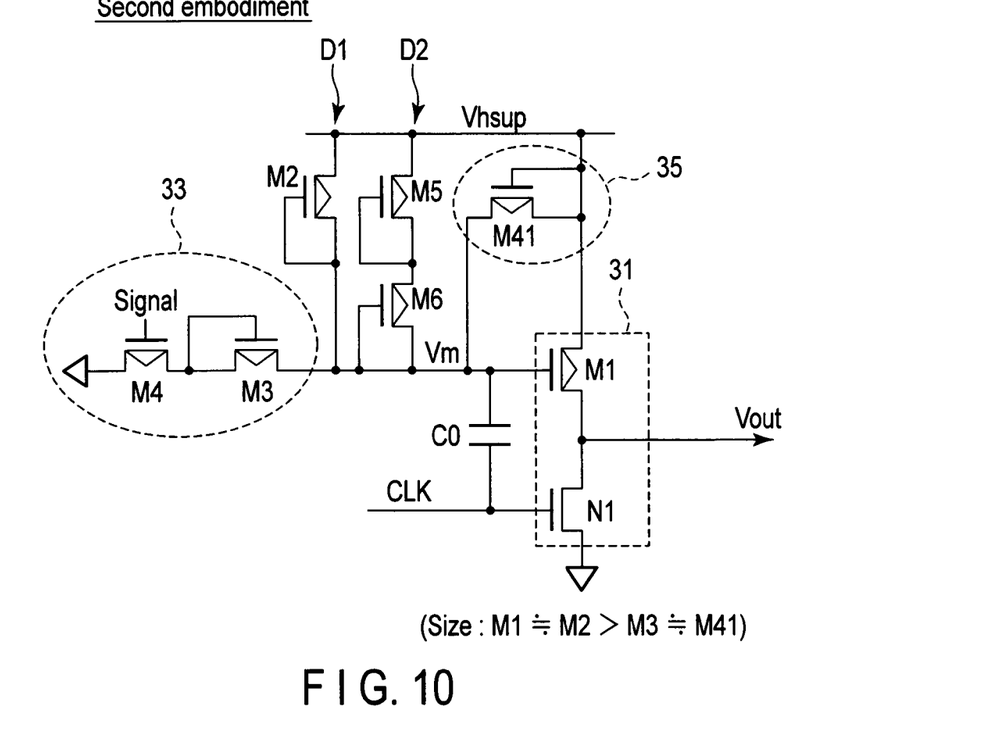
FIG. 10 is an equivalent circuit diagram showing the clock generation unit of a semiconductor integrated circuit device according to the second embodiment.

As shown in FIG. 10, a clock generation unit according to the second embodiment is different from that in the first embodiment in that there is also provided the upper limit circuit 35.

In this example, the limit circuit 35 includes a PMOS transistor M41. The PMOS transistor M41 has its source and gate connected to a power supply voltage Vhsup, and its drain connected to the node Vm.

The size of the transistor M41 is desirably almost the same as that of a transistor M3 which is larger than the size of a transistor M1 or M2 (Size: M1≈M2>M3≈M41).

<Variation in Voltage of Node Vm in Clock Generation Operation>

Figure 11:
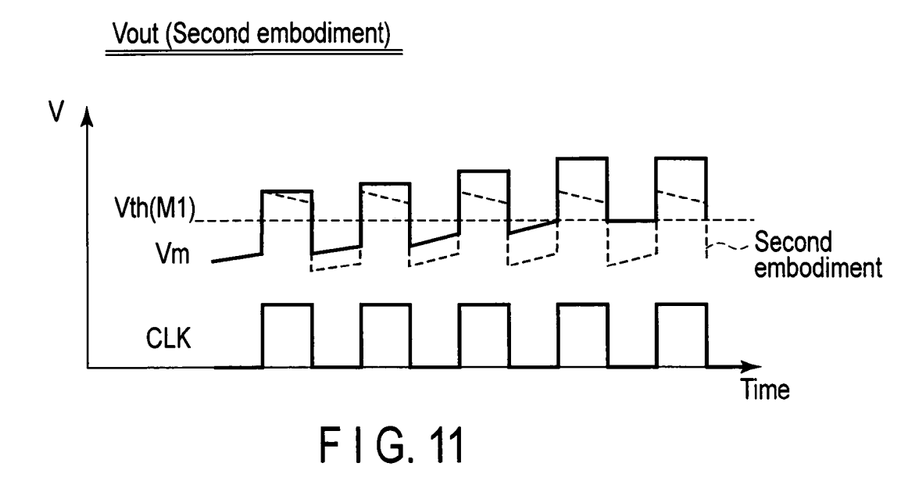
FIG. 11 is a timing chart showing a variation in voltage of a node Vm in a clock generation operation according to the second embodiment.

FIG. 11 shows a variation in voltage of the node Vm in a clock generation operation according to the second embodiment.

As described above, in this example, the transistor M41 serving as the limit circuit 35 is inserted. Since the transistor M41 is arranged, it is possible to limit an upper limit of the node Vm even when a clock CLK="H" level.

As a result, as indicated by a broken line in FIG. 11, the node Vm varies depending on the amplitude of the clock CLK. When the upper limit voltage level becomes larger than the power supply voltage Vhsup by a threshold value, however, the limit circuit 35 can control an upper limit of the voltage level of the node Vm by transferring charges to the power supply voltage Vhsup.

<Operation and Effect>

According to the semiconductor integrated circuit device according to the second embodiment, it is possible to obtain at least the same effects (1) and (2). According to this example, it is also possible to obtain the following effect (3).

(3) It is possible to limit an upper limit of the voltage of the node Vm in the clock generation operation.

The clock generation unit according to the second embodiment also includes the upper limit circuit 35. The transistor M41 serving as the limit circuit 35 is inserted. Since the transistor M4 is arranged, it is possible to limit an upper limit of the node Vm even when the clock CLK="H" level.

Consequently, as indicated by the broken line in FIG. 11, the node Vm varies depending on the amplitude of the clock CLK. When the upper limit voltage level becomes larger than the power supply voltage Vhsup by the threshold value, however, the limit circuit 35 can control an upper limit of the voltage level of the node Vm by transferring charges to the power supply voltage Vhsup.

By further providing the limit circuit 35 of this example in addition to the above-described first embodiment, it is possible to control the upper and lower limits of the amplitude of the node Vm.

Third Embodiment

Example when there is Also Provided OFF Circuit for Reliably Turning Off Inverter M1

A semiconductor integrated circuit device according to the third embodiment will be described with reference to FIG. 12. The third embodiment relates to an example when there is also provided an OFF circuit 36 for reliably rendering a PMOS transistor M1 of the inverter nonconductive (off). A repetitive detailed description of the same parts as in the first embodiment will be omitted.

Arrangement Example

Figure 12:
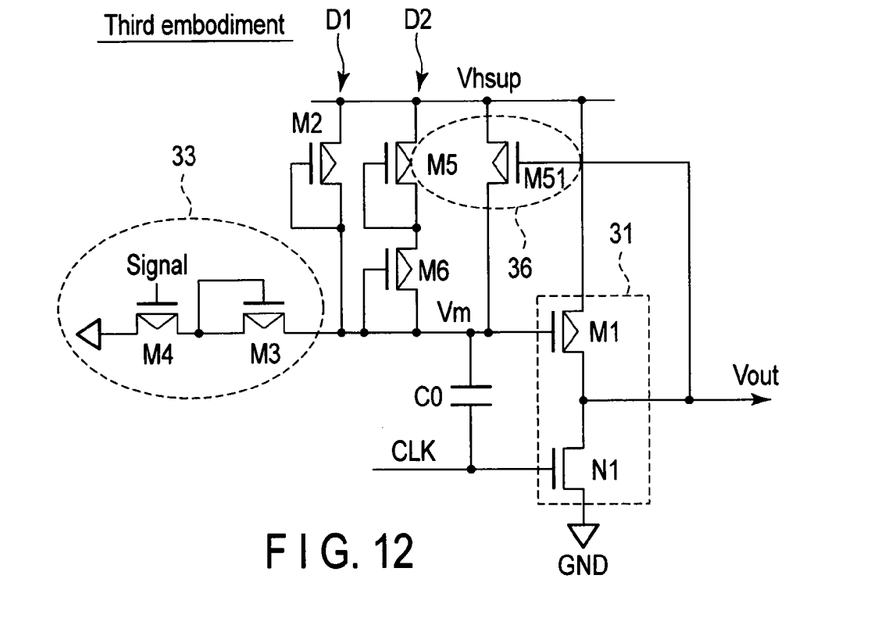
FIG. 12 is an equivalent circuit diagram showing the clock generation unit of a semiconductor integrated circuit device according to the third embodiment.

As shown in FIG. 12, a clock generation unit according to the third embodiment is different from that in the first embodiment in that there is also provided the OFF circuit 36.

In this example, the OFF circuit 36 includes a PMOS transistor M51. The PMOS transistor M51 has its source connected to a power supply voltage Vhsup, its drain connected to the gate (a node Vm) of the transistor M1, and its gate connected to an output Vout.

<Clock Generation Operation>

In the above arrangement, since the voltage Vhsup of the output Vout is supplied to the gate of the transistor M51 when a clock CLK="L" level in a clock generation operation, the transistor M51 is turned off. At this time, charges are not transferred to the node Vm via the transistor M51.

On the other hand, when the clock CLK="H" level, 0 V of the output Vout is supplied to the gate of the transistor M51. The transistor M51 is thus turned on, and charges are transferred via the transistor M51 until the node Vm reaches the voltage Vhsup, thereby reliably turning off the transistor M1.

The transistor M51 of the OFF circuit 36 does not work when the clock CLK="L" level, while serving to reliably turn off the transistor M1 when the clock CLK="H" level.

The output Vout of a CLK generator according to this embodiment is as described above.

<Operation and Effect>

According to the semiconductor integrated circuit device of the third embodiment, it is possible to obtain at least the same effects (1) and (2) described above.

A clock generation unit 19-1 of the semiconductor integrated circuit device according to the third embodiment is different from that in the first embodiment in that there is also provided the OFF circuit 36.

The transistor M51 of the OFF circuit 36 does not work when the clock CLK="L" level, while serving to reliably turn off the transistor M1 when the clock CLK="H" level. It is, therefore, possible to reliably turn off the transistor M1, thereby advantageously stabilizing the operation.

Fourth Embodiment

Example when Conductivity Type of Element of Each Circuit is Changed

A semiconductor integrated circuit device according to the fourth embodiment will be explained with reference to FIG. 13. The fourth embodiment relates to an example when the conductivity type of a transistor element of each circuit described above is changed (p-type→n-type). A repetitive detailed description of the same parts as in the first embodiment will be omitted.

Arrangement Example

Figure 13:
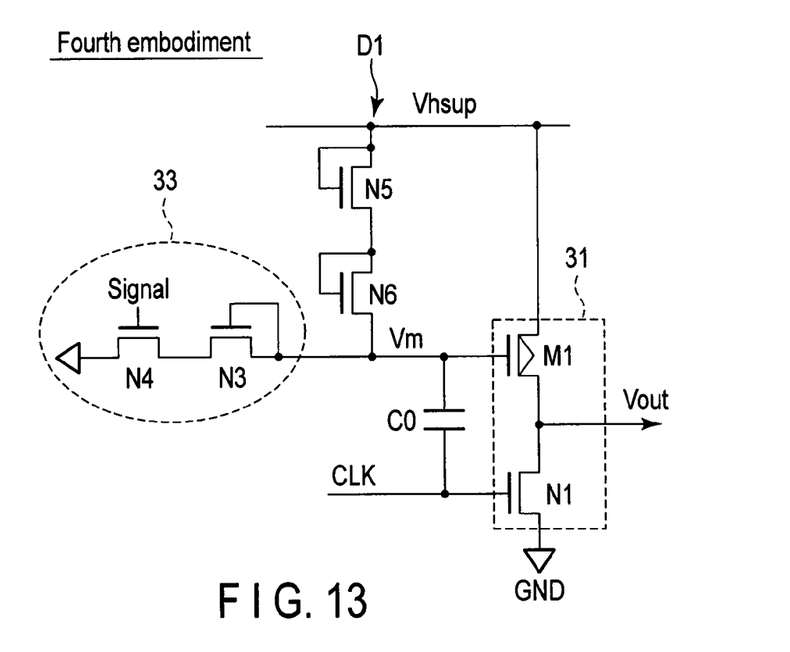
FIG. 13 is an equivalent circuit diagram showing the clock generation unit of a semiconductor integrated circuit device according to the fourth embodiment.

As shown in FIG. 13, even if the conductivity type of a transistor element of each circuit described above is changed to obtain an NMOS transistor, the same characteristics described above are obtained.

As shown in FIG. 13, an adjustment circuit 33 includes NMOS transistors N3 and N4.

A first diode circuit D1 includes NMOS transistors N5 and N6.

According to the semiconductor integrated circuit device of the fourth embodiment, at least the same effects (1) and (2) described above can be obtained. It is possible to apply the arrangement of this embodiment, as needed.

Fifth Embodiment

Example when Conductivity Type of Element of Each Circuit is Changed

A semiconductor integrated circuit device according to the fifth embodiment will be explained with reference to FIG. 14. The fifth embodiment relates to an example when the conductivity type of a transistor element of each circuit described above is changed (p-type→n-type). A repetitive detailed description of the same parts as in the first embodiment will be omitted.

Arrangement Example

Figure 14:
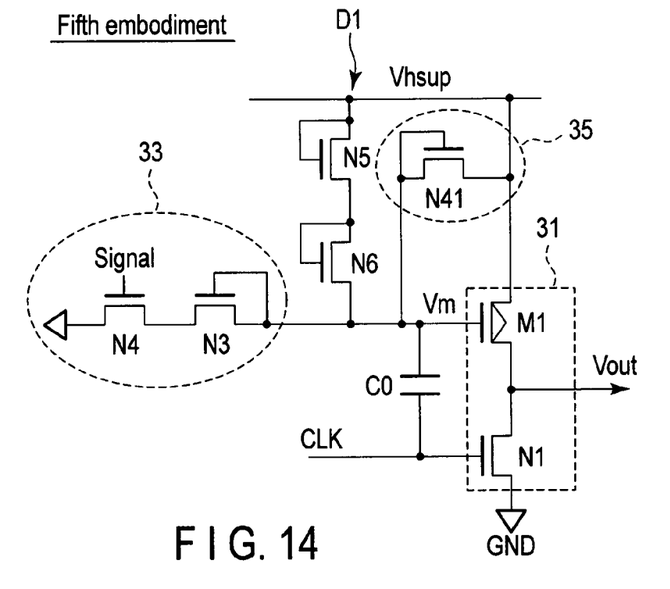
FIG. 14 is an equivalent circuit diagram showing the clock generation unit of a semiconductor integrated circuit device according to the fifth embodiment.

As shown in FIG. 14, even if the conductivity type of a transistor element of each circuit described above is changed to obtain an NMOS transistor, the same characteristics described above are obtained.

As shown in FIG. 14, a limit circuit 35 includes an NMOS transistor N41.

According to the semiconductor integrated circuit device of the fifth embodiment, at least the same effects (1) to (3) described above can be obtained. It is possible to apply the arrangement of this embodiment, as needed.

Sixth Embodiment

Example when Conductivity Type of Element of Each Circuit is Changed

A semiconductor integrated circuit device according to the sixth embodiment will be described with reference to FIG. 15. The sixth embodiment relates to an example when the conductivity type of a transistor element of each circuit described above is changed (p-type→n-type). A repetitive detailed description of the same parts as in the first embodiment will be omitted.

Arrangement Example

Figure 15:
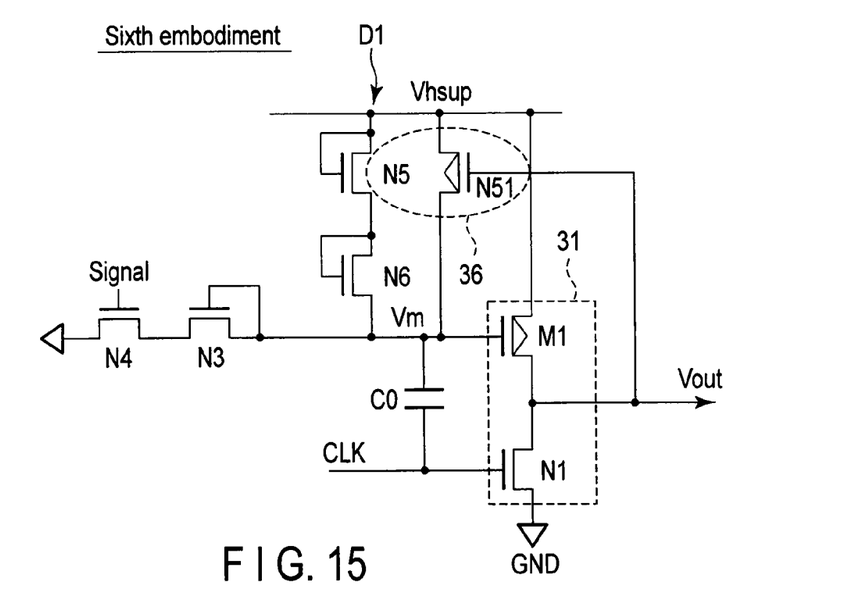
FIG. 15 is an equivalent circuit diagram showing the clock generation unit of a semiconductor integrated circuit device according to the sixth embodiment.

As shown in FIG. 15, even if the conductivity type of a transistor element of each circuit described above is changed to obtain an NMOS transistor, the same characteristics described above are obtained.

As shown in FIG. 15, an OFF circuit 36 includes an NMOS transistor N51.

According to the semiconductor integrated circuit device of the sixth embodiment, at least the same effects (1) and (2) described above can be obtained.

It is possible to apply the arrangement of this embodiment, as needed.

Comparative Example 1

A semiconductor integrated circuit device according to Comparative Example 1 will be explained with reference to FIGS. 16 and 17 to compare with the first to sixth embodiments.

Arrangement Example

Figure 16:
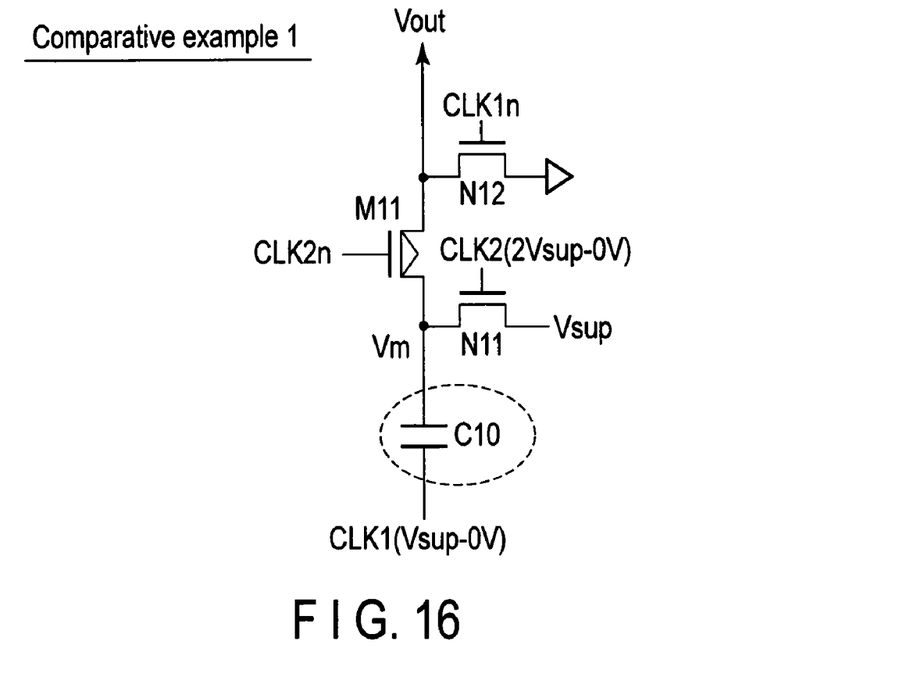
FIG. 16 is an equivalent circuit diagram showing the clock generation unit of a semiconductor integrated circuit device according to Comparative Example 1.

FIG. 16 shows the arrangement of a CLK generator according to Comparative Example 1. As shown in FIG. 16, the CLK generator according to Comparative Example 1 is used to generate a high output clock Vout from a basic power supply Vsup.

The CLK generator according to Comparative Example 1 includes n-type transistors N11 and N12, and a p-type transistor M11.

Furthermore, the CLK generator according to Comparative Example 1 is configured to generate an output Vout with a large amplitude using a plurality of input clocks CLK1, CLK1n, and CLK2n.

In this arrangement, assume that the clock CLK1 has an amplitude Vsup (assumed to be a low level power supply)–0

V, and a clock CLK2 has, as an upper limit, a voltage level (assumed to be 2Vsup) for passing the power supply voltage Vsup, and has an amplitude 2Vsup-0V. The clocks CLK1n and CLK2n have opposite phases to those of the clocks CLK1 and CLK2 and the same amplitudes as those of the clocks CLK1 and CLK2, respectively. Preparing such clocks enables to generate the clock Vout with a high amplitude.

According to the above arrangement, as a detailed operation, the amplitude of a node Vm can be given by $$Vm = Vsup + (Vsup - 0\,V) \qquad \text{equation (2)}$$

As represented by equation (2), since the gate voltage level of the PMOS transistor M11 drops when the voltage level of the node Vm becomes 2Vsup, a voltage level of 2Vsup is transferred as the output Vout. Since the gate voltage level of the PMOS transistor M11 becomes 2Vsup after a time ½T (T is the clock period) elapses, the PMOS transistor M11 is turned off. At the same time, since the NMOS transistor N12 which discharges charges from the output Vout is turned on, a clock with an amplitude 2Vsup-0 V is output.

Figure 17:
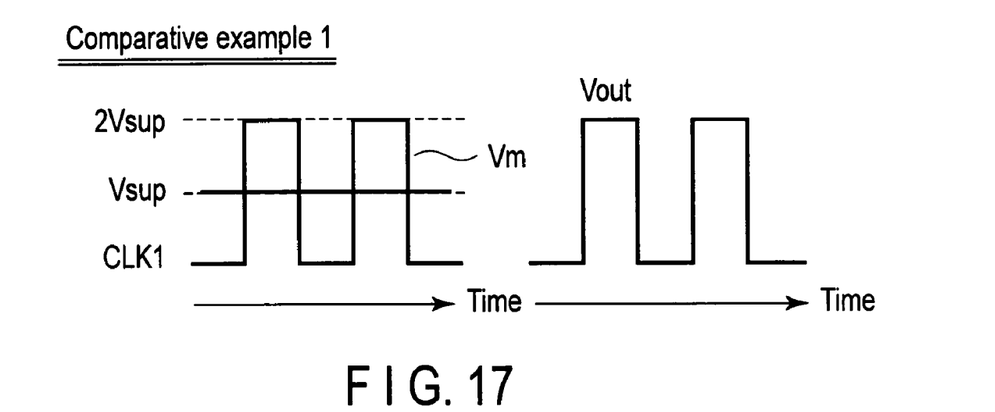
FIG. 17 is a timing chart showing an output of the clock generation unit of the semiconductor integrated circuit device according to Comparative Example 1.

FIG. 17 shows the output waveforms of the clocks CLK1, CLK2, CLK1n, and CLK 2n, the node Vm, and the output Vout.

In the arrangement of the CLK generator according to Comparative Example 1, however, a plurality of types (at least two types) of input clocks are necessary.

A generated clock is given by equation (3).

$$Vout(X,Y) = (Vsup \times n, 0) \qquad \text{equation (3)}$$

As represented by equation (3), n capacitors (Cap) are necessary to generate a high-voltage clock.

As described above, the arrangement according to Comparative Example 1 has a disadvantage that the device area increases.

Comparative Example 2

A semiconductor integrated circuit device according to Comparative Example 2 will be described with reference to FIG. 18 to compare with the above embodiments.

Arrangement Example

Figure 18:
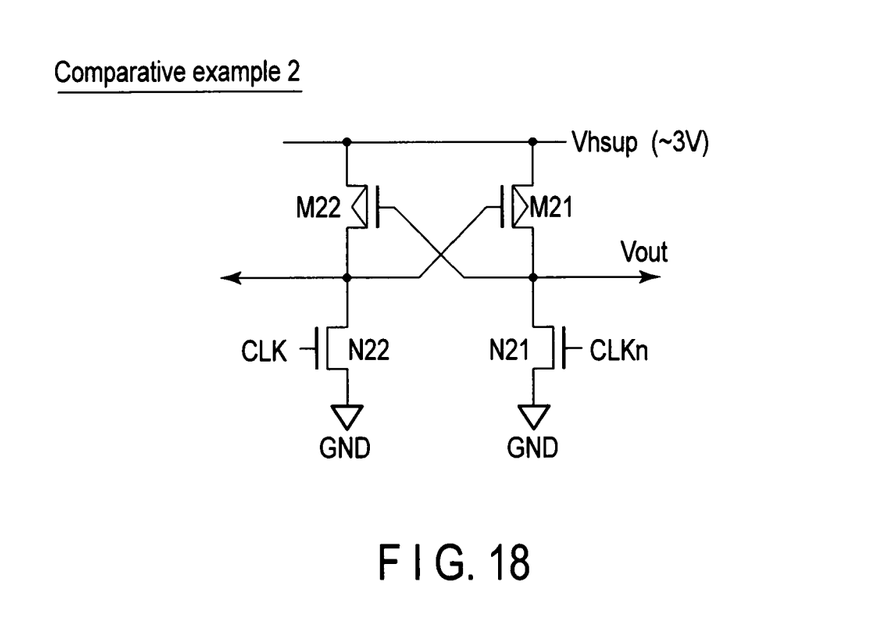
FIG. 18 is an equivalent circuit diagram showing the clock generation unit of a semiconductor integrated circuit device according to Comparative Example 2.

FIG. 18 shows the arrangement of a CLK generator according to Comparative Example 2. As shown in FIG. 18, the CLK generator according to Comparative Example 2 is of a level shifter type when assuming that another circuit (not shown) generates a high voltage source (to be denoted by Vhsup).

In the CLK generator according to Comparative Example 2, the number of types of input clocks to be prepared is small, as compared with Comparative Example 1. Since the CLK generator has a level shifter (cross-coupled) arrangement, the response speed of an output Vout1 (Vout2) is low with respect to the amplitude of a clock CLK1 (CLK2).

To solve this problem of low response speed, it is necessary to adjust the sizes of NMOS transistors N21 and N22 and PMOS transistors M21 and M22, thereby causing the output Vout1 (Vout2) to operate so as not to delay with respect to the clock CLK1 (CLK2).

In this case, however, as the voltage source Vhsup generates a higher voltage (for example, about 10 V or more), a current discharged by a ground power supply voltage GND increases and power consumption also increases. This is because accumulated charges Q on the NMOS transistors N21 and N22 need to be pumped out.

As described above, in the arrangement according to Comparative Example 1, the device area increases to generate a clock having, as an upper limit, a high voltage. In the arrangement according to Comparative Example 2, power consumption increases. In terms of these points, these arrangements are disadvantageous as compared with the arrangements according to the above embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit device comprising:
   an output circuit which includes an inverter having a first transistor and a second transistor whose current paths are series-connected between a first power supply voltage and a second power supply voltage;
   a first diode circuit one end of which is connected to the first power supply voltage, and the other end of which is connected to a control terminal of the first transistor; and
   an adjustment circuit which forms a current path for discharging a charge of the control terminal of the first transistor to the second power supply voltage when an input clock is at a first level.

2. The device of claim 1, further comprising a capacitor one electrode of which is connected to the control terminal of the first transistor, and the other electrode of which is connected to a control terminal of the second transistor and receives the input clock.

3. The device of claim 1, further comprising a second diode circuit one end of which is connected to the first power supply voltage, and the other end of which is connected to the control terminal of the first transistor.

4. The device of claim 1, wherein the first diode circuit includes a third transistor which determines an initial value of a voltage supplied to the control terminal of the first transistor.

5. The device of claim 1, further comprising a limit circuit which controls an upper limit of a voltage level of a voltage supplied to the control terminal of the first transistor.

6. The device of claim 1, further comprising an OFF circuit which renders the current path of the first transistor nonconductive when the input clock is at a second level.

7. A semiconductor integrated circuit device comprising a memory cell array in which a plurality of memory cells are arranged, and a power supply voltage generator which generates a power supply voltage to be supplied to the memory cell array by receiving a clock, wherein the power supply voltage generator comprises:
   an output circuit which includes an inverter having a first transistor and a second transistor whose current paths are series-connected between a first power supply voltage and a second power supply voltage;
   a first diode circuit one end of which is connected to the first power supply voltage, and the other end of which is connected to a control terminal of the first transistor; and
   an adjustment circuit which forms a current path for discharging a charge of the control terminal of the first transistor to the second power supply voltage when an input clock is at a first level.

8. The device of claim 7, wherein the power supply voltage generator further comprises a capacitor one electrode of which is connected to the control terminal of the first transistor, and the other electrode of which is connected to a control terminal of the second transistor and receives the input clock.

9. The device of claim 7, wherein the power supply voltage generator further comprises a second diode circuit one end of which is connected to the first power supply voltage, and the other end of which is connected to the control terminal of the first transistor.

10. The device of claim 7, wherein the first diode circuit includes a third transistor which determines an initial value of a voltage supplied to the control terminal of the first transistor.

11. The device of claim 7, wherein the power supply voltage generator further comprises a limit circuit which controls an upper limit of a voltage level of a voltage supplied to the control terminal of the first transistor.

12. The device of claim 7, wherein the power supply voltage generator further comprises an OFF circuit which renders the current path of the first transistor nonconductive when the input clock is at a second level.

* * * * *